(12) United States Patent
Park et al.

(10) Patent No.: US 11,881,342 B2
(45) Date of Patent: Jan. 23, 2024

(54) COIL ELECTRONIC COMPONENT

(71) Applicant: SAMSUNG ELECTRO-MECHANICS CO., LTD., Suwon-si (KR)

(72) Inventors: Kwang Il Park, Suwon-si (KR); Jong Min Lee, Suwon-si (KR)

(73) Assignee: SAMSUNG ELECTRO-MECHANICS CO., LTD, Suwon-si (KR)

( * ) Notice: Subject to any disclaimer, the term of this patent is extended or adjusted under 35 U.S.C. 154(b) by 931 days.

(21) Appl. No.: 16/554,060

(22) Filed: Aug. 28, 2019

(65) Prior Publication Data

US 2020/0126711 A1 Apr. 23, 2020

(30) Foreign Application Priority Data

Oct. 23, 2018 (KR) .......................... 10-2018-0126610

(51) Int. Cl.
*H01F 27/28* (2006.01)
*H01F 27/29* (2006.01)
(Continued)

(52) U.S. Cl.
CPC ..... *H01F 27/2804* (2013.01); *H01F 17/0013* (2013.01); *H01F 17/04* (2013.01);
(Continued)

(58) Field of Classification Search
CPC ............. H01F 17/0013; H01F 27/2804; H01F 2027/2809; H01F 17/0006; H01F 5/003;
(Continued)

(56) References Cited

U.S. PATENT DOCUMENTS 10,217,563 B2   2/2019 Wang et al.
10,453,602 B2   10/2019 Yoshioka et al.
(Continued)

FOREIGN PATENT DOCUMENTS

CN   103474199 A   12/2013
CN   104347262 A   2/2015
(Continued)

OTHER PUBLICATIONS

Korean Office Action dated Jul. 10, 2023, issued in corresponding Korean Patent Application No. 10-2018-0126610 with English translation.

(Continued)

*Primary Examiner* — Tszfung J Chan
(74) *Attorney, Agent, or Firm* — Morgan, Lewis & Bockius LLP

(57) ABSTRACT

A coil electronic component includes a support substrate having a first surface and a second surface opposing each other, a coil pattern disposed on the first surface of the support substrate, first and second conductive vias penetrating the support substrate and connected to one end and the other end of the coil pattern, respectively, an encapsulant encapsulating the support substrate and the coil pattern, and first and second external electrodes disposed on a lower surface of the encapsulant and electrically connected to the first and second conductive vias, respectively. The support substrate is disposed between the lower surface of the encapsulant and the coil pattern.

20 Claims, 4 Drawing Sheets

(51) Int. Cl.
 *H01F 17/00* (2006.01)
 *H01F 17/04* (2006.01)
 *H05K 9/00* (2006.01)

(52) U.S. Cl.
 CPC ......... *H01F 27/292* (2013.01); *H05K 9/0083* (2013.01); *H01F 2027/2809* (2013.01)

(58) Field of Classification Search
 CPC .. H01F 27/29; H01F 27/292; H01F 2017/002; H01F 2017/008; H01F 27/288; H01F 27/2885
 USPC .................................................. 336/200, 232
 See application file for complete search history.

(56) References Cited

U.S. PATENT DOCUMENTS

| | | | |
|---|---|---|---|
| 2006/0214759 A1 | 9/2006 | Kawarai | |
| 2015/0035640 A1* | 2/2015 | Wang | H01F 41/042 336/200 |
| 2015/0145627 A1 | 5/2015 | Sim et al. | |
| 2017/0178798 A1 | 6/2017 | Yoon et al. | |
| 2018/0075965 A1* | 3/2018 | Yoshioka | H01F 27/2823 |
| 2018/0166211 A1 | 6/2018 | Takatsuji | |
| 2019/0318868 A1* | 10/2019 | Chung | H01F 41/10 |
| 2019/0362873 A1* | 11/2019 | Arai | H01F 5/04 |
| 2020/0027645 A1* | 1/2020 | Yoshioka | H01F 27/255 |

FOREIGN PATENT DOCUMENTS

| | | | |
|---|---|---|---|
| CN | 105355361 A | 2/2016 | |
| CN | 106898479 A | 6/2017 | |
| EP | 1705672 A2 * | 9/2006 | ......... H01F 17/0006 |
| JP | H10-241983 A | 9/1998 | |
| JP | 2018-046051 A | 3/2018 | |
| JP | 2018-098270 A | 6/2018 | |
| KR | 10-2006-0102493 A | 9/2006 | |
| KR | 2015009391 A * | 1/2015 | ......... H01F 17/0013 |
| KR | 10-2015-0062012 A | 6/2015 | |
| KR | 10-1887106 B1 | 8/2018 | |

OTHER PUBLICATIONS

Office Action dated Nov. 14, 2023 issued in the corresponding Chinese Patent Application No. 201910981340.X with English tranlsation.

* cited by examiner

COIL ELECTRONIC COMPONENT

CROSS-REFERENCE TO RELATED APPLICATION(S)

This application claims benefit of priority to Korean Patent Application No. 10-2018-0126610 filed on Oct. 23, 2018 in the Korean Intellectual Property Office, the disclosure of which is incorporated herein by reference in its entirety.

TECHNICAL FIELD

The present disclosure relates to a coil electronic component.

BACKGROUND

As electronic devices such as digital televisions, mobile phones, laptops, and the like, have been designed to have reduced sizes, a coil electronic component applied in such electronic devices has been required to have a reduced size. To meet such demand, a large amount of studies into developing various types of coil-type or thin-film type coil electronic components have been conducted.

One important matter in developing a coil electronic component having a reduced size is to implement the same properties as before after reducing a size of a coil electronic component. To this end, it may be necessary to increase a content of a magnetic material filling a core. However, there may be a limitation in increasing a content of the magnetic material due to strength of an inductor body, changes in frequency property caused by insulating property, and for other reasons.

There have been continuous attempts to further reduce a thickness of a chip as a set including a coil electronic component has been designed to have a complex structure, multifunctionality, a reduced size, and the like. Accordingly, in the respective technical field, it has been required to secure high performance and reliability of a chip having a reduced size.

SUMMARY

An aspect of the present disclosure is to provide a coil electronic component with a lower electrode shape having improved relativity and inductor property.

According to an aspect of the present disclosure, a coil electronic component is provided, the coil electronic component including a support substrate having a first surface and a second surface opposing each other, a coil pattern disposed on the first surface of the support substrate, first and second conductive vias penetrating the support substrate and connected to one end and the other end of the coil pattern, respectively, an encapsulant encapsulating the support substrate and the coil pattern, and first and second external electrodes disposed on a lower surface of the encapsulant and electrically connected to the first and second conductive vias, respectively. The support substrate is disposed between the lower surface of the encapsulant and the coil pattern.

The coil electronic component may further include first and second connection electrodes disposed in the encapsulant, and connecting the first and second conductive vias to the first and second external electrodes, respectively.

Each of the first and second connection electrodes may have a width greater than a width of each of the first and second conductive vias.

The coil pattern may be disposed only on the first surface among the first and second surfaces of the support substrate.

The first and second external electrodes may be disposed only on the lower surface of the encapsulant.

The first and second conductive vias may be directly connected to the first and second external electrodes, respectively.

At least the second surface of the support substrate may be exposed from the encapsulant.

A portion of a side surface of the support substrate connecting the first and second surfaces of the support substrate may be exposed from the encapsulant.

$T_3 < T_1 + T_2$, in which $T_1$ and $T_2$ are thicknesses of an upper cover and a lower cover of the encapsulant disposed on and below the coil and the support substrate, respectively, and $T_3$ is a sum of thicknesses of the support substrate and the coil pattern.

$T_3 > T_1 + T_2$, in which $T_1$ and $T_2$ are thicknesses of an upper cover and a lower cover of the encapsulant disposed on and below the coil and the support substrate, respectively, and $T_3$ is a sum of thicknesses of the support substrate and the coil pattern.

The coil electronic component may further include an electromagnetic shielding portion disposed on a surface of the encapsulant.

The electromagnetic shielding portion may be disposed on an upper surface of the encapsulant opposing the lower surface.

The electromagnetic shielding portion may also be disposed on a side surface connecting the upper surface and the lower surface of the encapsulant.

The coil electronic component may further include a ground electrode disposed on the lower surface of the encapsulant and connected to the electromagnetic shielding portion.

The ground electrode may be disposed between the first and second external electrodes.

According to an aspect of the present disclosure, a coil electronic component is provided, the coil electronic component including a support substrate having a first surface and a second surface opposing each other; a coil pattern disposed on the first surface of the support substrate; first and second conductive vias penetrating the support substrate and connected to one end and the other end of the coil pattern, respectively; an encapsulant encapsulating the support substrate and the coil pattern; and first and second external electrodes disposed on the second surface of the support substrate and electrically connected to the first and second conductive vias, respectively. At least the second surface of the support substrate is exposed from the encapsulant.

The first and second external electrodes may be spaced apart from the encapsulant.

A portion of a side surface of the support substrate connecting the first and second surfaces of the support substrate is exposed from the encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
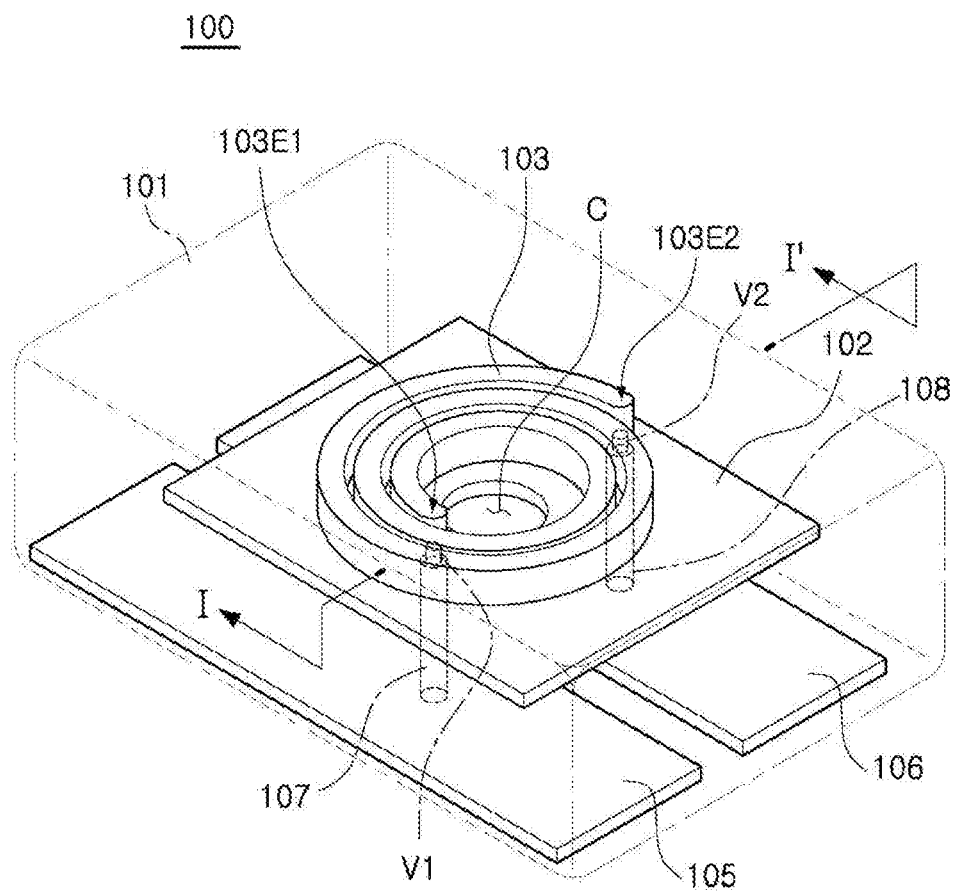
FIG. 1 is a perspective diagram illustrating a coil electronic component according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. Accordingly, shapes and sizes of the elements in the drawings can be exaggerated for clear description. Also, elements having the same function within the scope of the same concept represented in the drawing of each exemplary embodiment will be described using the same reference numeral.

Figure 2:
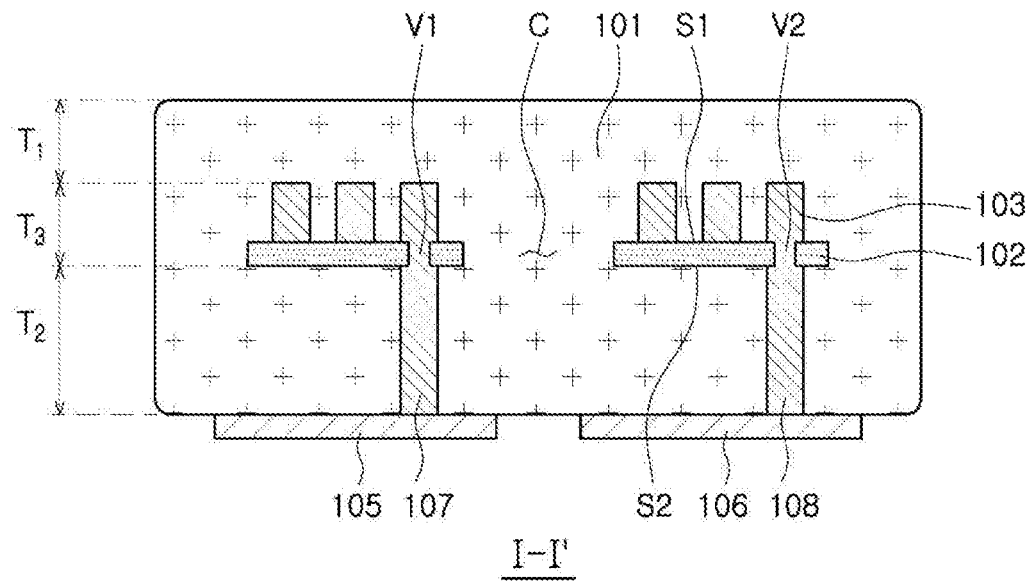
FIG. 2 is a cross-sectional diagram taken along line I-I' in FIG. 1.

FIG. 1 is a perspective diagram illustrating a coil electronic component according to an example embodiment. FIG. 2 is a cross-sectional diagram taken along line I-I' in FIG. 1. FIGS. 3 to 6 are cross-sectional diagrams illustrating a coil electronic component according to a modified example embodiment.

Referring to FIGS. 1 and 2, a coil electronic component 100 in the example embodiment may include an encapsulant 101, a support substrate 102, a coil pattern 103, and external electrodes 105 and 106. The coil pattern 103 and the external electrodes 105 and 106 may be connected to each other by conductive vias V1 and V2 penetrating the support substrate 102 and connection electrodes 107 and 108.

The encapsulant 101 may encapsulate at least portions of the support substrate 102 and the coil pattern 103, and may form an exterior of the coil electronic component 100. The encapsulant 101 may include magnetic grains and an insulating resin interposed between the magnetic grains. Surfaces of the magnetic grains may be coated with an insulating film. For example, the magnetic grains may be dispersed in the insulating resin.

As the magnetic grains included in the encapsulant 101, ferrite, a metal, and the like, may be used. When the magnetic grains are configured as a metal, the magnetic grains may be an Fe-based alloy, and the like. For example, the magnetic grains may be a nano-crystalline grain boundary alloy having a composition of Fe—Si—B—Cr, an Fe—Ni based alloy, and the like. When the magnetic grains are implemented by an Fe-based alloy as described above, although magnetic property such as permeability, and the like, may be improved, the magnetic grains may be vulnerable to electrostatic discharge. Accordingly, an additional insulation structure may be interposed between the coil pattern 103 and the magnetic grains.

The support substrate 102 may support the coil pattern 103, and may be implemented as a polypropylene glycol (PPG) substrate, a ferrite substrate or a metal-based soft magnetic substrate, and the like. As illustrated in the diagram, a through hole C may be formed in a central portion of the support substrate 102, penetrating the support substrate 102, and the through hole C may be filled with the encapsulant 101, thereby forming a magnetic core portion.

The coil pattern 103 may be disposed on at least one of a first surface S1 (an upper surface in the diagram) and a second surface S2 (a lower surface in the diagram) of the support substrate 102 opposing each other. The coil pattern 103 may be formed by a plating process generally used in the respective technical field, such as a pattern plating process, an anisotropic plating process, an isotropic plating process, or the like, and the coil pattern 103 may be configured to have a multilayer structure using a plurality of processes from among the aforementioned processes. In the example embodiment, the coil electronic component 100 may have a single-surface coil structure in which the coil pattern 103 may be disposed only on a single surface (for example, an upper surface in the example embodiment) of the support substrate 102, and the single-surface coil structure may be appropriate for reducing a size of the coil electronic component 100. The coil electronic component 100 having the single-surface coil structure may be effectively applied to a low profile component of which a thickness is less than a width.

The configuration in which the coil pattern 103 may be disposed only on the first surface S1 of the support substrate 102 may not exclude the configuration in which a conductive pattern such as a coil, and the like, may be formed on the second surface S2 of the support substrate 102. The configuration in which the coil pattern 103 may be disposed only on the first surface S1 of the support substrate 102 may indicate that the coil pattern 103 connected to the external electrodes 105 and 106 may only be disposed on the first surface S1 of the support substrate 102.

The conductive vias V1 and V2 may penetrate through the support substrate 102, and may be connected to one end 103E1 and the other end 103E2 of the coil pattern 103, respectively. The configuration in which the conductive vias V1 and V2 may penetrate through the support substrate 102 may indicate that side surfaces of the conductive vias V1 and V2 may not be exposed externally of the support substrate 102 and may be surrounded by the support substrate 102. Thus, in the example embodiment, the coil pattern 103 may be formed only on the first surface S1 of the support substrate 102, and may form an electrical connection structure with the external electrodes 105 and 106 by the conductive vias V1 and V2 penetrating the support substrate 102. Accordingly, the coil electronic component 100 with a lower surface electrode structure having a reduced size may be implemented. The conductive vias V1 and V2 may be obtained by forming through-holes in the support substrate 102 and filling the through-holes with a plating metal, and the like.

In the example embodiment, the connection electrodes 107 and 108 may be disposed in the encapsulant 101 and may connect the conductive vias V1 and V2 to the external electrodes 105 and 106, respectively. In this case, as illustrated in the diagram, each of the connection electrodes 107 and 108 may have a width greater than a width of each of the conductive vias V1 and V2, and the widths may be configured as above in consideration of structural stability, Rdc property, and the like.

Among surfaces of the encapsulant 101, when a surface adjacent to the first surface S1 of the support substrate 102 is defined as an upper surface, and a surface adjacent to the second surface S2 is defined as a lower surface, the external electrodes 105 and 106 may be disposed on the lower surface of the encapsulant 101, and may be electrically connected to the conductive vias V1 and V2, respectively. Thus, the coil electronic component 100 in the example embodiment may have a lower surface electrode structure, and in an example embodiment, the first and second external electrodes 105 and 106 may be disposed only on the lower surface of the encapsulant 101. By having the lower surface electrode structure, the coil electronic component 100 may have a reduced size, and when the coil electronic component 100 is mounted on a substrate, a short defect with adjacent components may be reduced such that reliability may improve. The first and second external electrodes 105 and 106 may be formed using a paste including a metal having high electrical conductivity, and the paste may be a conductive paste including one of nickel (Ni), copper (Cu), tin (Sn) or silver (Ag), or alloys thereof, for example. The first and second external electrodes 105 and 106 may further include a plating layer formed thereon. In this case, the plating layer may include one or more elements selected from a group consisting of nickel (Ni), copper (Cu), and tin (Sn). For example, a nickel (Ni) plated layer and a tin (Sn) plated layer may be formed in order.

In the example embodiment, thicknesses of covers of the encapsulant 101, the support substrate 102, and the coil pattern 103 may be adjusted in accordance with intended properties of the coil electronic component 100. For example, when thicknesses of an upper cover and a lower cover of the encapsulant 101 are defined as $T_1$ and $T_2$, respectively, and a sum of thicknesses of the support substrate 102 and the coil pattern 103 is defined as $T_3$, in the example embodiment illustrated in FIG. 2, $T_1$, $T_2$, and $T_3$ may satisfy $T_3 < T_1 + T_2$. The thickness $T_1$ of the upper cover of the encapsulant 101 may be a distance from an upper surface of the coil pattern 103 to the upper surface of the encapsulant 101, and the thickness $T_2$ of the lower cover may be a distance from the second surface S2 of the support substrate 102 to the lower surface of the encapsulant 101. In the example embodiment illustrated in FIG. 2, as an amount of the encapsulant 101 including magnetic grains may be sufficiently secured, Ls property of the coil electronic component 100 may improve.

Figure 3:
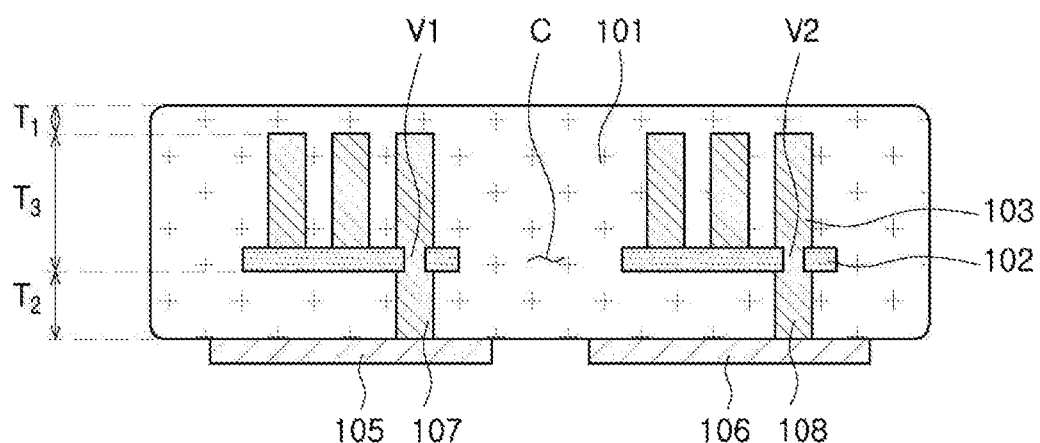
FIGS. 3 to 6 are cross-sectional diagrams illustrating a coil electronic component according to a modified example embodiment.

Differently from the aforementioned example embodiment, in the example embodiment illustrated in FIGS. 3, $T_1$, $T_2$, and $T_3$ may satisfy the condition of $T_3 > T_1 + T_2$, and the coil pattern 103 may have a relatively great thickness. Accordingly, a thickness of the coil electronic component 100 may further be reduced. Also, an electrical connection path between the coil pattern 103 and the external electrodes 105 and 106 may be reduced such that an Rdc property of the component may improve.

Figure 4A:
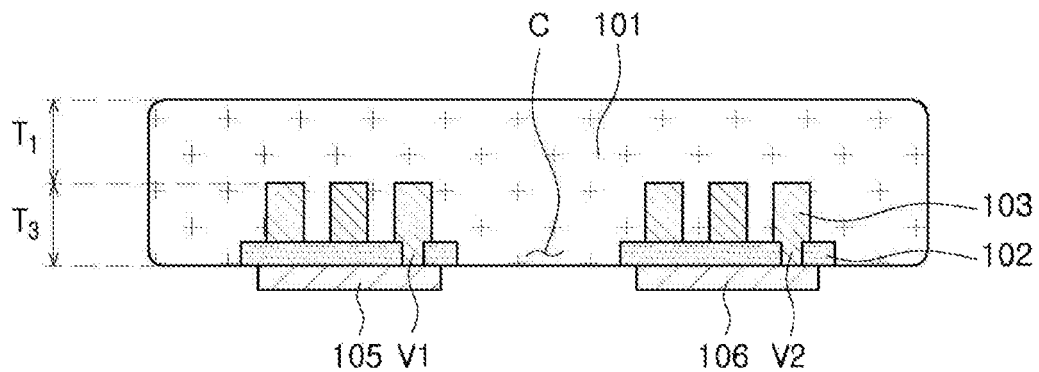
Figure 4B:
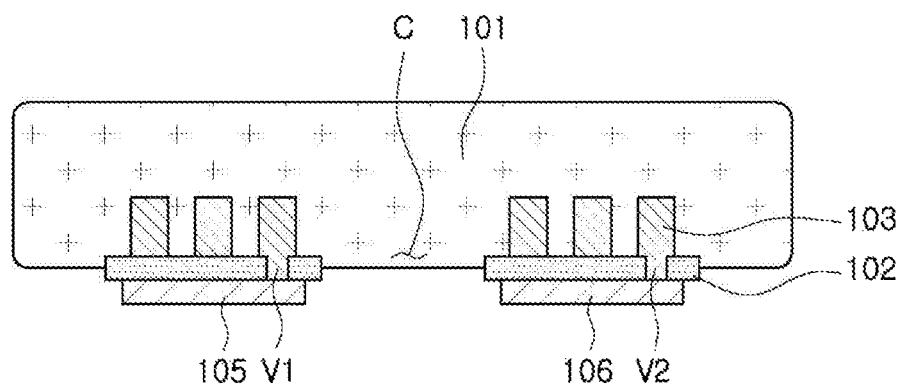

In the modified example illustrated in FIG. 4A, a lower cover of the encapsulant 101 may not be provided, and the conductive vias V1 and V2 may be directly connected to the external electrodes 105 and 106, respectively. As illustrated in the diagram, at least the second surface S2 of the support substrate 102 may be exposed from the encapsulant 101. Accordingly, the external electrodes 105 and 106 may be easily disposed on the exposed support substrate 102 such that a lower surface electrode may be effectively implemented, and a thickness of the component may be effectively reduced. In this case, the support substrate 102 may be partially embedded in the encapsulant 101 or may be entirely embedded in the encapsulant 101. For example, a portion of a side surface of the support substrate 102 connecting the first and second surfaces S1 and S2 of the support substrate 102 may be exposed from the encapsulant 101, as shown in FIG. 4B. In this case, the first and second external electrodes may be disposed on the second surface S2 of the support substrate 102 and spaced apart from the encapsulant 101.

Figure 5:
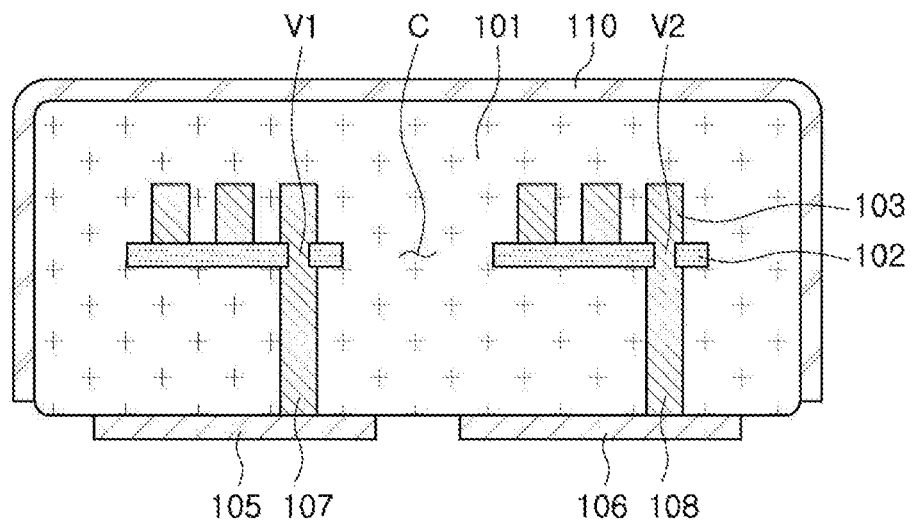
Figure 6:
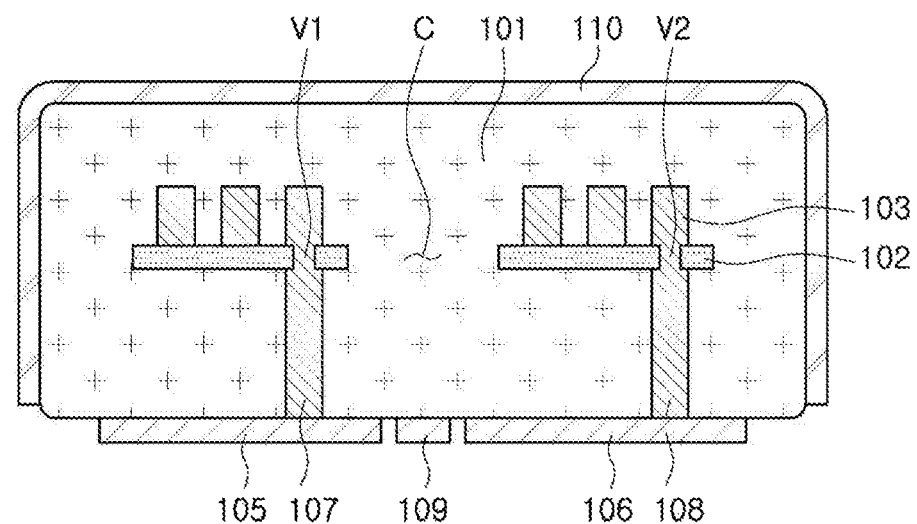

FIGS. 5 and 6 illustrate an example embodiment in which an electromagnetic shielding portion is provided. Referring to FIG. 5, an electromagnetic shielding portion 110 may be disposed on a surface of the encapsulant 101 in the coil electronic component described in the aforementioned example embodiment. The electromagnetic shielding portion 110 may include a magnetic material which may shield electromagnetic waves produced in the component or from an external entity. For example, the electromagnetic shielding portion 110 may include a metal alloy, ferrite, and the like, and the electromagnetic shielding portion 110 may be configured as a thin film formed of an Fe-based alloy. As an example, the electromagnetic shielding portion 110 may be disposed on an upper surface of the encapsulant 101, and may also be disposed on a side surface connecting an upper surface and a lower surface of the encapsulant 101. In this case, the portions formed on the upper surface and the side surface of the encapsulant 101 may be integrated with each other such that the electromagnetic shielding portion 110 may have a curved region. The electromagnetic shielding portion 110 may also be disposed in a lower portion of the encapsulant 101, and in this case, a shielding effect may further improve. When the electromagnetic shielding portion 110 is formed of a conductive material, a position of the electromagnetic shielding portion 110 may be configured to not in contact with the external electrodes 105 and 106. FIG. 6 illustrates an example in which a ground electrode 109 is disposed on a lower surface of an encapsulant 102 to improve an electromagnetic shielding performance. In this case, the electromagnetic shielding portion 110 may be connected to the ground electrode 109.

According to the aforementioned example embodiments, as the coil electronic component has a lower surface electrode structure, and when the coil electronic component is mounted on a substrate, a short defect with other components may be prevented. Further, even when a size of the coil electronic component is reduced, relatively high reliability and inductor property may be secured.

While the exemplary embodiments have been shown and described above, it will be apparent to those skilled in the art that modifications and variations could be made without departing from the scope of the present invention as defined by the appended claims.

What is claimed is:
1. A coil electronic component, comprising:
  a support member having a first surface and a second surface opposing each other;
  a coil pattern disposed on the first surface of the support member, and including a lower surface to face the support member, an upper surface opposing the lower surface, and a side surface connecting the lower surface to the upper surface;
  first and second conductive vias spaced apart from edges of the support member, penetrating the support member, and connected to one end and another end of the coil pattern, respectively;
  an encapsulant encapsulating the support member and the coil pattern; and
  first and second external electrodes disposed on a lower surface of the encapsulant and connected to the first and second conductive vias, respectively,
  wherein the support member is disposed between the lower surface of the encapsulant and the coil pattern,
  the coil pattern protrudes from the first surface of the support member, such that the upper surface of the coil pattern and a portion of the side surface of the coil pattern connected to the upper surface of the coil pattern are spaced apart from the support member, and the encapsulant is disposed between adjacent turns of the coil pattern.

2. The coil electronic component of claim 1, further comprising:
first and second connection electrodes disposed in the encapsulant, and connecting the first and second conductive vias to the first and second external electrodes, respectively.

3. The coil electronic component of claim 2, wherein each of the first and second connection electrodes has a width greater than a width of each of the first and second conductive vias.

4. The coil electronic component of claim 1, wherein the coil pattern disposed only on the first surface among the first and second surfaces of the support member.

5. The coil electronic component of claim 1, wherein the first and second external electrodes are disposed only on the lower surface of the encapsulant.

6. The coil electronic component of claim 1, wherein the first and second conductive vias are directly connected to the first and second external electrodes, respectively.

7. The coil electronic component of claim 1, wherein at least the second surface of the support member is exposed from the encapsulant.

8. The coil electronic component of claim 7, wherein a portion of a side surface of the support member connecting the first and second surfaces of the support member is exposed from the encapsulant.

9. The coil electronic component of claim 1, wherein T3<T1+T2, in which T1 and T2 are thicknesses of an upper cover and a lower cover of the encapsulant disposed on and below the coil and the support member, respectively, and T3 is a sum of thicknesses of the support member and the coil pattern.

10. The coil electronic component of claim 1, wherein T3>T1+T2, in which T1 and T2 are thicknesses of an upper cover and a lower cover of the encapsulant disposed on and below the coil and the support member, respectively, and T3 is a sum of thicknesses of the support member and the coil pattern.

11. The coil electronic component of claim 1, further comprising:
an electromagnetic shielding portion disposed on a surface of the encapsulant.

12. The coil electronic component of claim 11, wherein the electromagnetic shielding portion is disposed on an upper surface of the encapsulant opposing the lower surface.

13. The coil electronic component of claim 12, wherein the electromagnetic shielding portion is also disposed on a side surface connecting the upper surface and the lower surface of the encapsulant.

14. The coil electronic component of claim 13, further comprising:
a ground electrode disposed on the lower surface of the encapsulant and connected to the electromagnetic shielding portion.

15. The coil electronic component of claim 14, wherein the ground electrode is disposed between the first and second external electrodes.

16. The coil electronic component of claim 1, wherein the first and second external electrodes are spaced apart from the encapsulant.

17. The coil electronic component of claim 1, wherein the first and second external electrodes are in contact with the support member.

18. The coil electronic component of claim 2, wherein the first and second connection electrodes are spaced apart from at least two surfaces of the encapsulant connected to the lower surface of the encapsulant.

19. The coil electronic component of claim 2, wherein the first connection electrode extends from the first conducive via to the first external electrode in a direction in which the first conductive via extends from the one end, and
the second connection electrode extends from the second conducive via to the second external electrode in a direction in which the second conductive via extends from the another end.

20. The coil electronic component of claim 1, wherein the first conductive via overlaps the first external electrode in a penetrating direction of the first conductive via in the support member, and the second conductive via overlaps the second external electrode in a penetrating direction of the second conductive via in the support member.

* * * * *